United States Patent [19]

Patel et al.

[11] Patent Number: 5,701,017
[45] Date of Patent: Dec. 23, 1997

[54] SEMICONDUCTOR DEVICE AND METHOD FOR ITS MANUFACTURE

[75] Inventors: Nalin K. Patel; Jeremy H. Burroughes, both of Cambridge, United Kingdom

[73] Assignee: Kabushiki Kaisha Toshiba, Kawasaki, Japan

[21] Appl. No.: 557,843

[22] Filed: Nov. 14, 1995

[30] Foreign Application Priority Data

Nov. 15, 1994 [GB] United Kingdom ............. 9423262
Oct. 25, 1995 [JP] Japan ........................... 9521884

[51] Int. Cl.$^6$ ............................................. H01L 29/201
[52] U.S. Cl. ............................ 257/27; 257/24; 257/194
[58] Field of Search ............................ 257/24, 192, 194, 257/26, 27, 29

[56] References Cited

U.S. PATENT DOCUMENTS 5,396,089  3/1995  Wieck et al. ......................... 257/192
5,406,094  4/1995  Arimoto et al. ...................... 257/27

FOREIGN PATENT DOCUMENTS 60-149169  8/1985  Japan ................................. 257/194
5-90611    4/1993  Japan ................................. 257/26

OTHER PUBLICATIONS

Peatman, et al., "Narrow Channel 2–D MESFET for Low Power Electronics," IEEE Transactions on Electron Devices, vol. 42, No. 9, Sep. 1995, pp. 1569–1573.

"In–Plane–Gated Quantum Wire Transistor Fabricated With Directly Written Focused Ion Beams" pp. 928–930. Appl. Phys. Letter. 56(10), Mar. 5, 1990. A. D. Wieck and K. Ploog.

"Quantized Conductance of Point Contacts in a Two–Dimensional Electron Gas" pp. 848–850. Physical Review Letters vol. 60, No. 9. B. J. Van Wees, et al., Feb. 1988.

"Fabrication and Characterisation of Direct Schottky Contacts to Two–Dimensional Electron Gas in GaAs/AlGaAs Quantum Wells" pp. 521–523. Extended Abstracts of the 1993 International Conference on Solid State Devices and Materials. Giorgio Schweeger, et al.

*Primary Examiner*—Jerome Jackson
*Assistant Examiner*—John Guay
*Attorney, Agent, or Firm*—Oblon, Spivak, McClelland, Maier & Neustadt, P.C.

[57] ABSTRACT

A semiconductor device according to the invention is characterized by comprising a heterostructure which comprises an active layer in which carriers can flow within a conduction channel, the heterostructure including a recessed region in which part of the conduction channel is disposed and substantially in the same plane as a pair of side gate, thereby defining a restricted conduction region of the conduction channel.

16 Claims, 3 Drawing Sheets

SEMICONDUCTOR DEVICE AND METHOD FOR ITS MANUFACTURE

BACKGROUND OF THE INVENTION

1. Field of the Invention

The present invention relates to a semiconductor device and a method for its manufacture. It particularly relates to a so-called quantum-effect semiconductor device.

2. Description of the Related Art

It is well known that such quantum-effect devices can be made by arranging layers of semiconductor layers of different bandgaps, it is possible to produce a quantum well adjacent to an interface in order to confine carriers so that the current flowing in the well layer between source and drain regions can be modulated by means of a control potential applied to any overlying gate electrode. The carriers, usually of high mobility, may exist in two dimensions to behave as a "two-dimensional electron gas" (2DEG) or they may be influenced by means of applied electrode potentials to exist substantially in only one dimension, i.e., as a "one-dimensional electron gas" (1DEG) otherwise sometimes referred to as a "quantum wire."

Of course, the majority carriers can be electrons or holes so equivalent devices utilizing a two-dimensional hole gas (2DHG) or one-dimensional hole gas (1DHG) can also be realized. However, for simplicity, the generic terms 2DEG or 1DEG will be used herein and should be understood as encompassing both possibilities, unless specifically indicated to the contrary.

In terms of practical devices, it is normal for devices of the aforementioned general kind to employ a plurality of quantum wires in order to permit an adequate amount of current to flow. Conveniently, this can be affected by using a superlattice for forming an "array" of gate electrodes.

A particular class of quantum-effect devices consists of those exhibiting one-dimensional ballistic transport. These were devised a number of years ago. They enabled the length and width of the conduction region to be reduced to sub-micron lengths. This device had the novel feature that the conduction was quantised in units of $e^2/h$ (Wharam et al., Phys. C21 L209 1988), with the conduction proportional to the number of one-dimensional (1D) channels which can propagate through the constriction. In principle, this behavior could lead to the development of multi-state devices. The intrinsic capacitance of the latter kind of device was also very small which suggests use of such devices in high speed circuits (Fedichkin et al., Appl. Phys. Lett. 64 2535 1994). The aforementioned devices however had a number of drawbacks. These included the necessity of using high resolution electron beam lithography for their production, low process yields. Moreover, they operated only at very low temperatures (of the order 4 K) and required low bias voltages. Attempts have been made to increase the operation temperature and voltage range (this requires increasing the 1 D subband energy) but operation is still much lower even than liquid nitrogen temperature of 77 K with subband energies of only a few meV (Snider et al., Appl. Phys. Lett. 59 2727 1991).

Most of these previous devices have used surface "split-gates" to define the one-dimensional region (Thornton et al., Phys. Rev. Lett. 56 1198 1986). The electrostatic potential due to the gate voltage is thus used to control the potential profile and width of the channel, which in turn determines the conductance. The degree of confinement and hence the subband energy spacing is however difficult to control.

Recently, another device was proposed where the surface gates were modified to improve control of the confining potential (Chou et al., Appl. Phys. Lett. 63 788 1993) but the operational temperature is still low.

SUMMARY OF THE INVENTION

A new device according to the present invention uses a regrowth stage to define side gates which are in the same plane as the conduction region.

Thus, the first aspect of the present invention provides a semiconductor device comprising a heterostructure which comprises an active layer in which carriers can flow within a conduction channel, the heterostructure including a recessed region in which part of the conduction channel is disposed and substantially in the same plane as a pair of side gates, thereby defining a restricted conduction region of the conduction channel.

In one form of device according to the invention, e.g., in the form of a transistor, at least one first gate being disposed over the heterostructure, above the restricted conduction region.

This device according to the present invention allows the use of additional front and back gates. By applying different voltages to each of the gates, much better control of the channel region potential can be achieved. Since the in-plane gates have greater control on the channel width, wider channels can be used and hence optical lithography defined devices may be used. This in turn means that low cost full wafer processing can be easily achieved.

Normally, the conduction channel will be arranged so that carriers flow within the active layer, between a source region and a drain region, respectively disposed on either side of the side gates. Preferably, a second gate (i.e., a back gate) is arranged on the opposite side of the heterostructure, relative to the first gate and also being disposed over (or directly beneath, depending on the direction from which the device is views) the restricted conduction region. This allows better control of conduction through the restricted region.

One from of device according to the present invention is a device in which carriers are confined in a puddle of 100 or so (holes or electrons). Such a puddle is commonly referred to as a "quantum dot" or "quantum box." In this kind of structure, electron motion is confined in all three dimensions. However, in the context of the present invention, these terms also cover the situations where the particle wavefunction is spatially small relative to the linear dimensions of the confinement volume, so that the structure does not exhibit true quantum behavior.

This kind of quantum dot confinement has conventionally been realized by placing four or more depleting Schottky gates, e.g., in a turnstile arrangement on the surface of a semiconductor heterostructure which itself contains a 2DEG. The gates squeeze the electron gas such that the remaining two degrees of freedom are impaired. This additional squeezing or confinement produces tunneling barriers around the dot through which electrons must pass if they are to enter or exit the dot. Such transport through the dot is then affected by applying an external current or voltage to the dot. This external bias raises the energy of electrons, allowing them to pass over and/or tunnel through the tunneling barriers.

Single electron charging, commonly referred to as Coulomb Blockade, manifests itself in the current-voltage characteristics of quantum dots when the confinement length is sufficiently small ($\leq 300$ nm) and the number of electrons is sufficiently small (several hundred or less). The single electron charging energy, the Coulomb energy, is the energy penalty incurred by having to add a whole electron to the dot when electrostatics require only a fractional amount of charge to produce neutrality between the dot and the surrounding reservoir of electrons. The charging energy is about $e^2/2C$, where C is the capacitance of the dot.

A consequence of this charging energy is that if one measures conductance or resistance through the dot as a function of voltage applied across the dot, one should see "oscillations" in the conductance/resistance with a period of e/C. Alternatively, one can measure conductance/resistance as function of the confinement width and see similar oscillations. Oscillations arise in the latter case because the capacitance changes with confinement width, and therefore so does the charging energy $e^2/2C$ necessary for an electron to enter/exit the dot. For dots created by means of depleting Schottky gates, the confinement width is varied via the voltage Vfg applied to these gates. Thus one expects to see oscillations in conductance/resistance as a function of gate bias Vfg.

In principle, a device which utilizes Coulomb Blockade offers a wide range of possible applications, for example, ultra-miniature transistors and memory devices. However, the known structures utilizing Schottky gates in a turnstile configuration have been found to work only at very low temperatures, e.g., $\leq 4$ K.

The devices of the present invention which work on the Coulomb blockade principle comprise more than two side gates, e.g., four or six side gates to confine a puddle of carriers within the 2DEG plane. Optionally, front and/or back gates may also be provided. Such devices may be operated to control movement of single carriers into or out of the quantum box "puddle," by tunneling or by changing the energy level spacing within the quantum box by changing its dimensions, to permit carriers to enter and leave it, or to cause carriers to be trapped. This may be effected by varying the side gate potentials and/or potentials applied to any front gate or back gate. Alternatively, the source/drain potential may be varied.

In any event, for all devices according to the present invention, in order to permit the ballistic transport necessary to enable quantised conductance, the length of the restricted conduction region is preferably less than 10 μm, most preferably around 1 μm. However, for some system, e.g., InAs/GaSb/AlGaSb, this may be too short and a length around 100 μm or less may be appropriate. The width of the restricted conduction region is typically 0.5 μm or less.

A second aspect of the present invention provides a semiconductor device comprising an active semiconductor layer situated between first and second outer semiconductor structures, a side gate layer being located between the first outer semiconductor structure and the active semiconductor layers, first and second gates respectively overlying the first and second outer semiconductor structures, wherein the active layer, second outer semiconductor structure and second gate are formed at least over a recessed region intersecting the first outer semiconductor structure, the recessed portion dividing the side gate layer to define first and second gates.

In preferred embodiments, there may be one or more additional layers between the active layer and the first and/or second outer semiconductor layers.

The present invention also encompasses a method of making a semiconductor device which exhibits quantised conductance. Devices according to the present invention can thus be made by selectively etching an underlying semiconductor structure on top of which is disposed a side gate layer, to expose a recess. The active layer and upper semiconductor structure can then be formed by a regrowth structure, over the recess. In this way, the restricted conduction region of the device lies substantially between the two side gates left after the selective etching through the side gate layer.

Thus, a third aspect of the present invention provides a method of making a semiconductor device, the method comprising: forming a first outer semiconductor structure; forming a side gate layer over the first outer semiconductor structure; selectively etching the side gate layer and first outer semiconductor structure to expose a recessed region intersecting the side gate layer to define respective first and second side gates; forming an active layer over at least the recessed region; and forming a second outer semiconductor structure over the active layer.

In the case of devices having an overlying first gate, the method of the present invention comprises the first step of forming a first gate over the second outer semiconductor structure.

The devices of the present invention may also be used as a memory cell. It has been found that in certain circumstances, conductance through the device will be reduced when a potential applied to the side-gates depletes-out carriers in the conduction region but conduction is not restored when this potential is removed. However, conduction can be restored upon application of thermal/infrared or optical energy. This may occur in devices with impurities on the regrowth facet of the side gate.

A practical memory device would of course comprise an array of such devices, each acting as a memory cell, but in any even, the present invention encompasses a single device comprising an array of devices according to the first or second aspect of the present invention.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which.

DETAILED DESCRIPTION OF THE PREFERRED EMBODIMENTS

Figure 1:
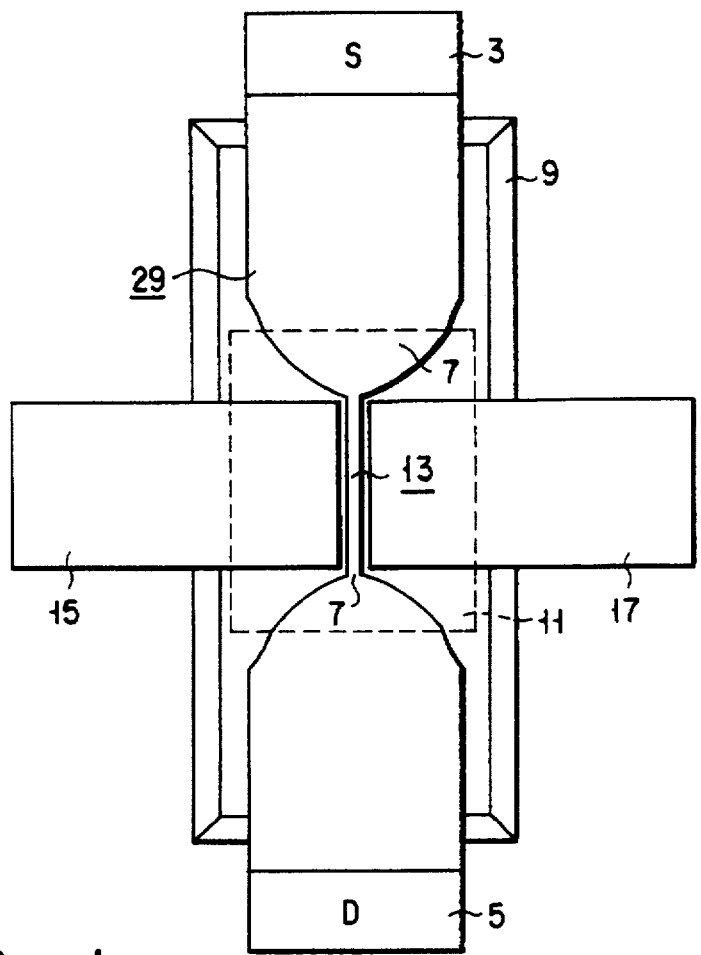
FIG. 1 shows the general structure of a transistor according to the present invention in plan view.

As seen in FIG. 1, a transistor 1 comprises a source 3 and a drain region 5, interconnected by a channel region 7 in which a high mobility 2DEG (or 2DHG) can be induced. The 2DEG can be influenced by means of potentials applied to a back gate 9, below the 2DEG and a front gate 11 situated above the 2DEG.

The channel region 7 includes a constriction region 13 in which the 2DEG can be constricted in the manner described hereinbelow by voltages applied to a first side gate 15 and a second side gate 17. To permit quantised conductance, which is the desired mechanism of operation of the device, it is essential that ballistic transport must be able to occur. This means that the length of the constriction region 13 must be sufficiently short, e.g., of the order of 1 µm and certainly less than 10 µm.

Figure 2:
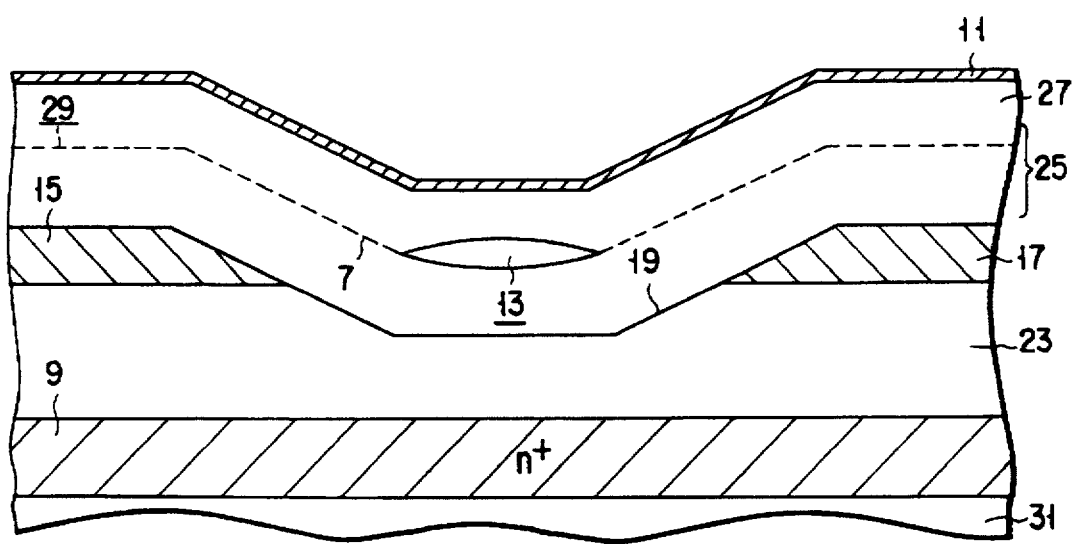
FIG. 2 shows the general structure of FIG. 1 in cross-sectional view to explain the principle of operation of the transistor.

FIG. 2 shows how the side gates 15, 17 are defined by a recess 19 etched through a side gate layer 21 partially into a lower semiconductor structure 23 on which the side gate layer 21 is formed. The back gate 9 is disposed underneath the lower structure 23, i.e., on the opposite surface relative to the side gate layer 21.

An active layer 25 is formed over the completes aforementioned structure including the recess 19. An upper semiconductor structure 27 is formed over the active layer 25 and finally, the front gate 11 is disposed over the complete device. The compositions of the upper and lower structures 23, 27 are such that in use, a high mobility 2DEG 29 can be induced in the active layer 25, effectively to act as the conduction channel 7.

It will be seen that because the active layer is downwardly deformed in the recess 19, the constricted conduction region 13 of the 2DEG 29 lies substantially in the same plane as the side gates 15, 17.

In use, potentials are applied to the sources 3, drain 5, back gate 9 and front gate 11 in a manner conventional for a high electron mobility transistor (HEMT) such as to induce the 2DEG 29 to enable switching on and off of the current due to carriers flowing between the source and drain. However, by applying a negative voltage to the side gates 15, 17, the 2DEG can be depleted except in the constriction region 13, where the 2DEG becomes one-dimensional.

Thus, the side gates control the width of the conduction channel within the constriction region and the front and back gates are used to alter the potential profile. However, because a short (ca 1 µm) one dimensional channel region is formed within the constriction region, conductance becomes quantised.

Figure 3:
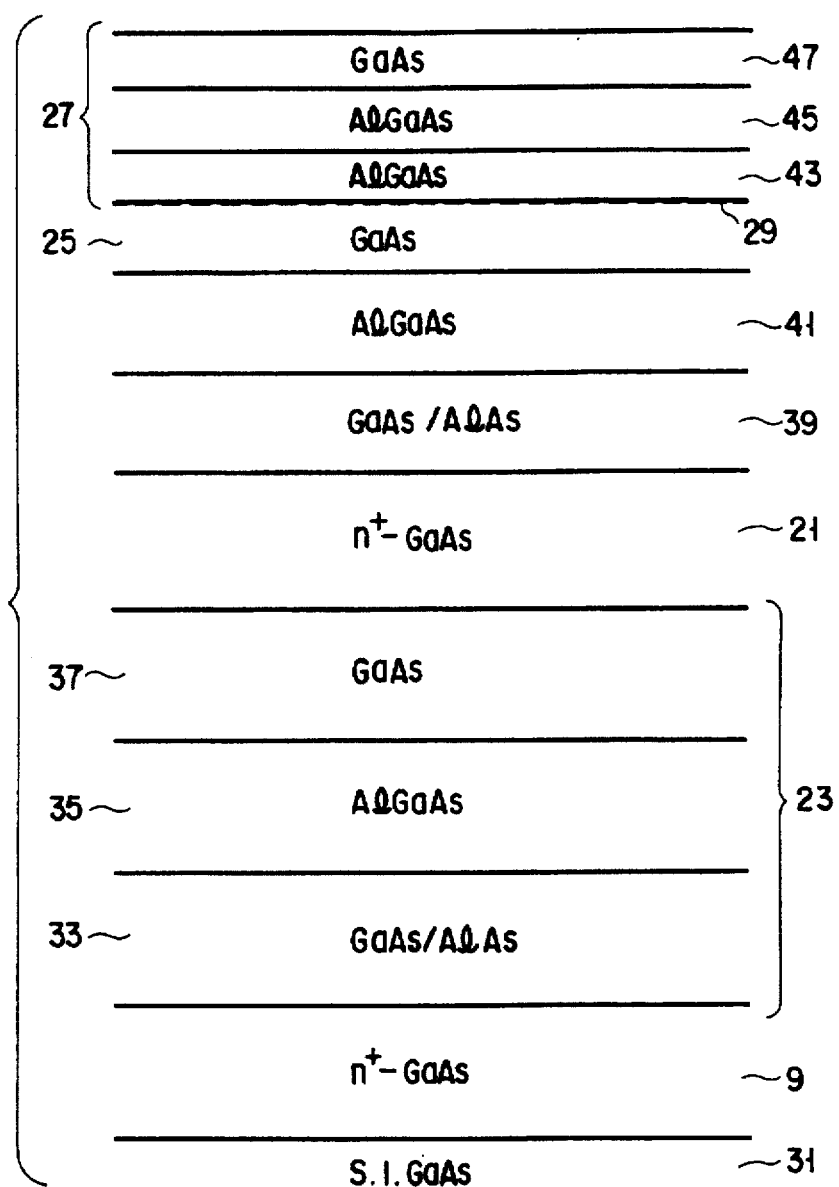
FIG. 3 shows the detailed growth structure of the transistor shown in FIGS. 1 and 2.

The method of making the device shown in FIGS. 1 and 2 will now be explained in detail by reference to FIG. 3.

The back gate 9 is formed as a 200 nm n$^+$-doped patterned layer on top of a semi-insulating GaAs buffer layer 31. Next, the lower semiconductor structure 23 is formed on the back gate 9. This lower structure 23 consists of a 120 nm GaAs/AlAs superlattice 33 formed over the back gate 9. On top of this lattice is formed, first, a 120 nm AlGaAs layer 35 and then an undoped GaAs layer 37 of 200 nm to complete the lower structure 23.

The side gate layer 21 is next formed on the lower semiconductor structure 23 and then selectively etched through to form the recess 19 as seen in FIG. 2.

Over the etched structure, including recess 19 is then formed by a second regrowth a 120 nm GaAs/AlAs superlattice 39, then a 120 nm AlGaAs first barrier layer 41, followed by the 40 nm GaAs active layer 25. The upper semiconductor structure 27 is then formed over the active layer 25.

The upper semiconductor structure 27 consists of (in order of formation) an AlGaAs undoped layer 43 of 20 nm thickness (so that the 2DEG 29 is induced adjacent to the upper interfacial surface of the active layer), then a 40 nm doped AlGaAs upper barrier layer 45, and finally a 10 nm GaAs cap layer 47. The front gate 11 is of course formed over the final resultant structure.

Figure 4:
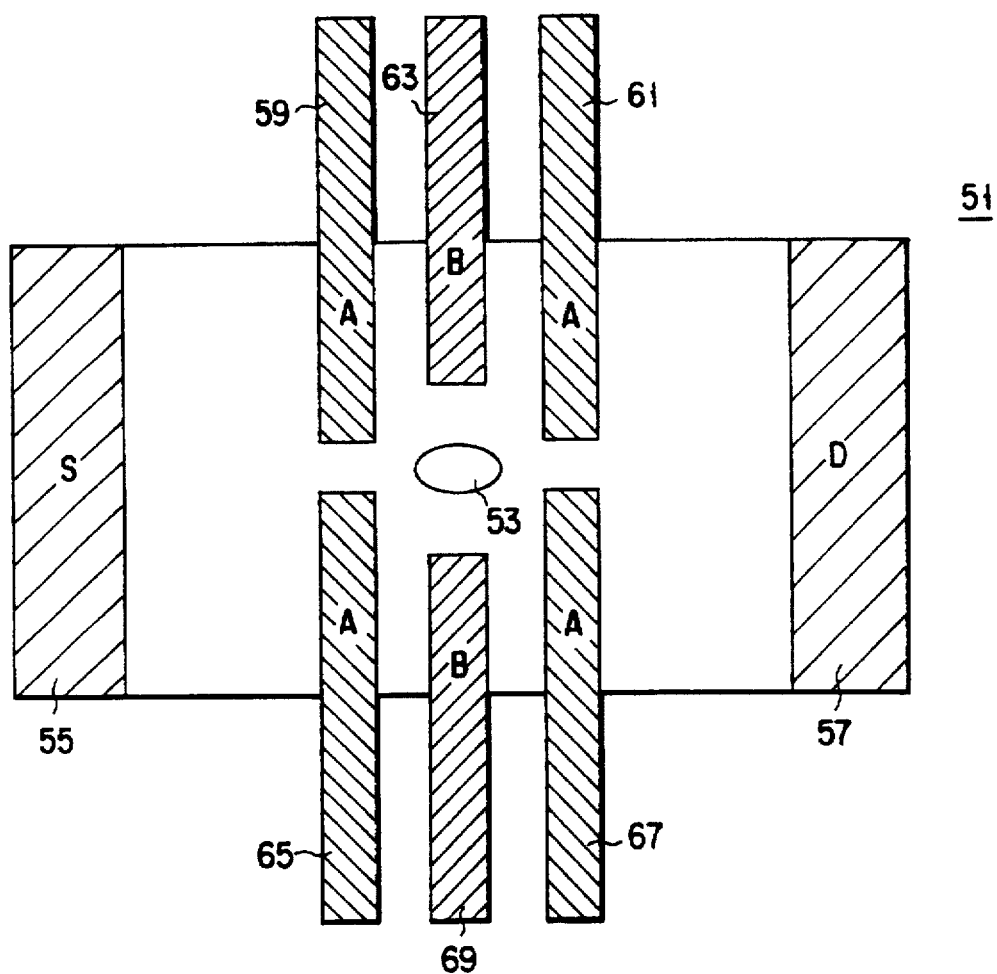
FIG. 4 shows a plan view of another embodiment of the present invention.

FIG. 4 shows a plane view of another embodiment of the present invention in the form of a device 51, capable of confining a quantum dot 53 in a 2DEG. A cross section through the device is the same as shown in FIG. 2, except that the front gate 11 and back gate 9 are omitted. However, in similar embodiments a front and/or back gate could be employed.

In the plane of the 2DEG, between a source 55 and a drain 57, are arranged one pair of end side gate 59 61, between which is situated a middle side gate 63. These gates are all arranged spaced apart and in line along one side of the source-drain axis.

On the other side of the source-drain axis are arranged, further end side gates 65, 67, between which is situated, and spaced apart therefrom, another middle side gate 69.

Figure 5:
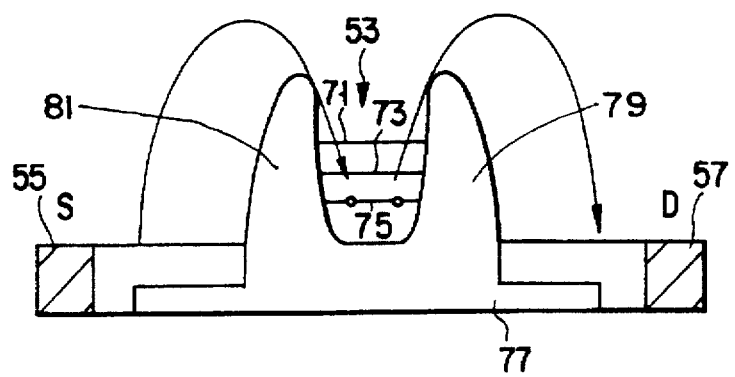
FIG. 5 shows a diagram for explaining the operation of the device shown in FIG. 4.

The end side gates 59, 61, 65, 67 are used to define the barrier layer between the source 55 and drain 57, and the quantum dot region 53. The middle side gates 63, 69 are used to vary the size of the quantum dot and hence the energy spacing of the energy levels 71, 73, 75 in the dot, as is seen in FIG. 5. The shaded area 77 in the cross-sectional view of FIG. 5 is not structural but represents the "quantum box" resulting from the application of suitable potential to the various side gates.

Applied gate potentials can be used to "squeeze" or "relax" the walls 79, 81 of the quantum box in order to change the energy levels so that carriers are trapped or move in and out of the box as desired. Variations of the source-drain voltage can also be used to the same end.

The present invention is not limited only to the aforementioned described embodiment. Modifications of these embodiments, as well as other embodiments, all within the scope of the present invention as defined by the appended claims, will now in the light of this disclosure, become apparent to persons skilled in the art.

For example, any heterostructure capable of inducing a 2DEG (or 2DHG), especially a 2DEG (or 2DHG) of high mobility, may be used. Although n-type side gates are used in the preferred described embodiments, of course p-type gates could be substituted.

Figure 6:
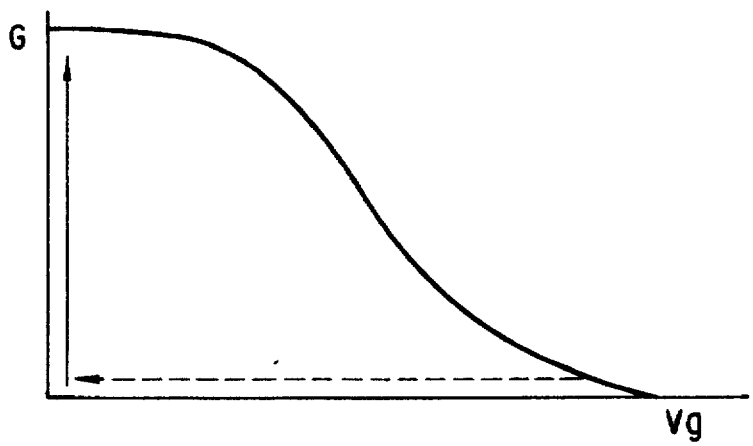
FIG. 6 shows a plot of transconductance vs side gate voltage for explaining how a device according to the present invention can function as a cell of a semiconductor memory.

As alluded to above, if the device such as shown in FIGS. 1 and 2 is fabricated with impurities on side gate regrowth facets, it can give rise to behavior as depicted in FIG. 6.

As the side gate potential $V_g$ is increased, carriers in the conduction region under the constriction region 13 are depleted-out so that the transconductance G (source-drain) falls. However, when the potential $V_g$ is removed, the transconductance does not recover (broken line). However, on application of thermal/infrared or optical energy, e.g., from an LED above the device, at zero $V_g$, the transconductance is restored to its original level (arrowed line).

Such an arrangement can act as a non-volatile memory cell. Application of the potential $V_g$ of a value to turn-off the device (equivalent to switching from logical 1 to logical 0). Then, activation of the LED re-activates conduction (equivalent to switching from logical 0 to logical 1). Of course, a practical arrangement would comprise an array of such devices.

Additional advantages and modifications will readily occur to those skilled in the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor device comprising a heterostructure which comprises an active layer in which carriers can flow within a conduction channel, the heterostructure including a recessed region in which part of the conduction channel is disposed and substantially in the same plane as a pair of side gates, thereby defining a restricted conduction region of said conduction channel.

2. A device according to claim 1, further comprising at least one additional side gate.

3. A device according to claim 1, further comprising at least one first gate disposed over the heterostructure, above the restricted conduction region.

4. A device according to claim 3, further comprising at least one additional side gate.

5. A device according to claim 1, in which a source region and a drain region are disposed on opposite sides of the side gates, the restricted conduction region, the source and drain regions contacting the conduction channel.

6. A device according to claim 5, further comprising at least one additional side gate.

7. A device according to claim 5, further comprising at least one first gate disposed over the heterostructure, above the restricted conduction region.

8. A device according to claim 7, further comprising at least one additional side gate.

9. A device according to claim 7, further comprising a second gate overlying the restricted conduction region on the opposite side of the heterostructure relative to the first gate.

10. A device according to claim 9, further comprising at least one additional side gate.

11. A device according to claim 1, wherein the length of the restricted conduction region is less than 100 µm.

12. A device according to claim 1, further comprising means for subjecting the device to one of thermal/infrared and optical radiation.

13. A device according to claim 1, wherein said device is formed in an array.

14. A semiconductor device comprising:

a first outer semiconductor structure;

a second outer semiconductor structure;

an active semiconductor layer situated between the first and second outer semiconductor structures;

a side gate layer being located between the first outer semiconductor structure and the active semiconductor layer; and first and second gates respectively overlying the first and second outer semiconductor structures, wherein the active layer, the second outer semiconductor structure and the second gate are formed at least over a recessed region intersecting the first outer semiconductor structure and the recessed region divides the side gate layer to define first and second side gates.

15. A device according to claim 14, wherein said device is formed in an array.

16. A device according to claim 14, further comprising means for subjecting the device to one of thermal/infrared and optical radiation.

* * * * *

UNITED STATES PATENT AND TRADEMARK OFFICE
CERTIFICATE OF CORRECTION

PATENT NO. : 5,701,017
DATED : December 23, 1997
INVENTOR(S) : Nalin K. PATEL et al.

It is certified that error appears in the above-indentified patent and that said Letters Patent is hereby corrected as shown below:

On the title page, Item [30], the 2nd Priority Data should read:

-- Oct. 25, 1995   [GB]    United Kingdom ....... 9521884 --

Signed and Sealed this

Twenty-fourth Day of February, 1998

Attest:

BRUCE LEHMAN

*Attesting Officer*    *Commissioner of Patents and Trademarks*